United States Patent [19]
Ojha

[11] Patent Number: 5,885,881
[45] Date of Patent: Mar. 23, 1999

[54] PLANAR WAVE GUIDE CLADDING

[75] Inventor: Sureshchandra Mishrilal Ojha, Harlow, United Kingdom

[73] Assignee: Northern Telecom Limited, Montreal, Canada

[21] Appl. No.: 842,022

[22] Filed: Apr. 23, 1997

[30] Foreign Application Priority Data

Apr. 24, 1996 [GB] United Kingdom .................... 9608566

[51] Int. Cl.⁶ ........................................... G02B 6/10
[52] U.S. Cl. .............................. 438/381; 438/31; 385/130
[58] Field of Search ................................ 438/31, 29, 381; 385/129, 130, 132

[56] References Cited

U.S. PATENT DOCUMENTS 5,253,319  10/1993  Bhagavatula ............................ 385/129

OTHER PUBLICATIONS

Rossnagel, "Glow Discharge Processes and Sources for Etching and Deposition", in Thin Film Processes II, edited by Vossen et al., Academic Press, pp. 18, 25–26 and 30–33 (no month given), 1991.

Reif et al., "Plasma–Enhanced Chemical Vapor Deposition", in Thin Film Processes II, edited by Vossen et al., Academic Press, p. 541 (no month given), 1991.

*Primary Examiner*—Charles Bowers
*Assistant Examiner*—Keith Christianson
*Attorney, Agent, or Firm*—Lee, Mann, Smith, McWilliams, Sweeney & Ohlson

[57] ABSTRACT

An optical circuit device having a core supported on a substrate incorporates a wave guide being in a layer of the core. The structure is provided with a cladding layer by depositing by means of a PECVD process a cladding material on the wave guide core and maintaining a negative bias between the substrate or the core and earth while the deposition is proceeding.

12 Claims, 1 Drawing Sheet

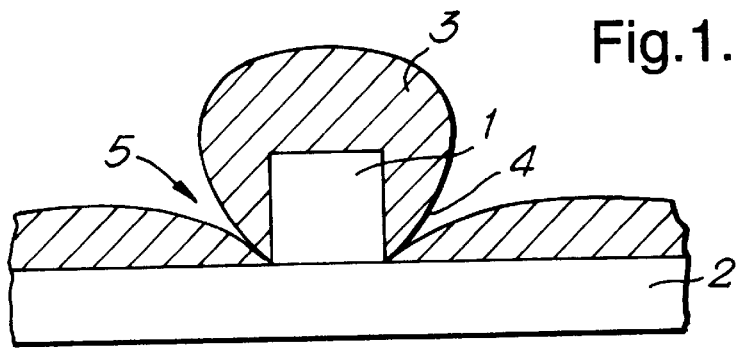
Fig.1. (PRIOR ART)
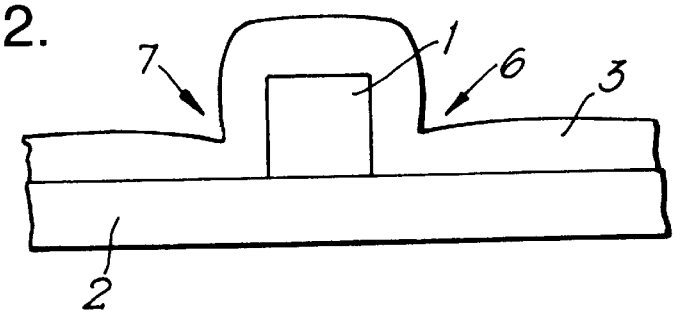
Fig.2.
Fig.3.
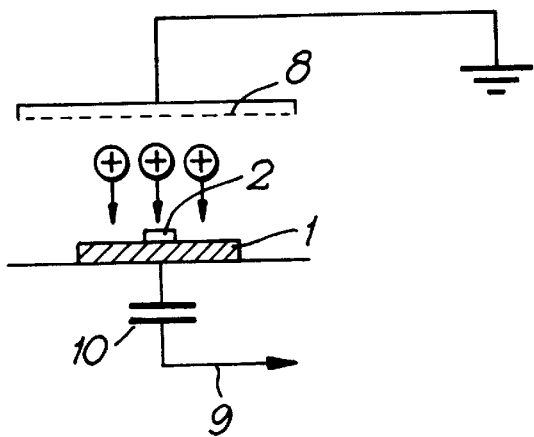
Fig.4.
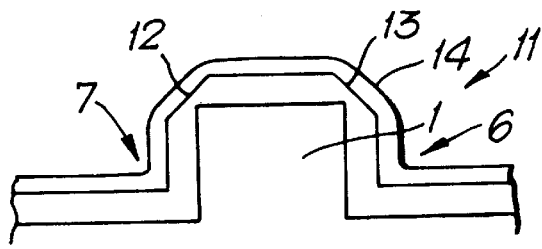

PLANAR WAVE GUIDE CLADDING

The present invention relates to the cladding of a channel or planar wave guide and to a method of providing such a cladding.

BACKGROUND OF THE INVENTION

In a typical arrangement, a channel or planar wave guide includes an elongated dielectric core, such as doped silica, deposited on a highly insulating buffer layer, e.g. undoped silica, which itself lies on a suitable elongated substrate, such as silicon. The cladding lies as a final deposited layer covering the length and width of the wave guide core, and also covering adjoining regions of the insulating buffer layer. Such wave guides are known either as channel or planar wave guides, and will be hereinafter referred to as "planar".

Ideally the cladding should conform well to the topography of the wave guide and there should be consistency of the deposited cladding layer especially with regard to refractive index homogeneity throughout its volume, both to provide good performance in the transmission of signals and for longevity. In practice however, the presence of voids, particularly those resulting from a failure to cover adequately the "corners", where the core and buffer meet the cladding, are difficult to avoid and can seriously reduce the production yield when such structures are manufactured commercially.

SUMMARY OF THE INVENTION

An object of the invention is to minimise or to overcome this disadvantage.

A further object of the invention is to provide an improved process for providing a surface cladding on a planar wave guide structure.

According to the invention there is provided a method of cladding a planar wave guide optical circuit device having a core supported on a substrate, the wave guide being etched in a layer of the core, including the steps of depositing by means of a PECVD process a cladding material on the wave guide core and of maintaining a negative bias between the substrate or the core and earth while the deposition is proceeding.

The arrangement to be described below aims to provide both improved conformity and consistency of the cladding, in addition to minimising the heating-up of the substrate and wave guide core during the deposition of the cladding.

In an arrangement to be described below, as an example, there is described a method of cladding a planar wave guide which includes the steps of depositing cladding material by means of a plasma enhanced chemical vapour deposition (PECVD) process on to a core and its surroundings, while preferably developing and maintaining a negative d.c. bias on the core. Preferably the bias is developed by feeding power at a radio frequency between, e.g. 50 kHz and 13.5 MHz, In order to promote the production of a plasma beam from required precursor materials. The radio frequency power is fed through a series capacitor to the core and substrate in the plasma chamber, whereby a required bias is developed as a result of the difference in mobility between electrons and positive ions, the deposit being bombarded by positive ions resulting from the negative bias on the core.

The cladding may be deposited in a plurality of separate stages, each separated by an etching stage and, if desired also, by an annealing stage. The preferred etching is also carried out by means of a PECVD process using fluorine or carbon tetrafluoride ($CT_4$), with or without oxygen.

The preferred cladding material is boron and phosphorus doped silica glass, which has a satisfactorily low flow temperature and an acceptable refractive index when interfaced with a silica wave guide core.

BRIEF DESCRIPTION OF THE DRAWINGS

A wave guide which has been clad using a previously proposed method will now be described, together with examples of wave guides clad using methods illustrative of the invention, with reference to the accompanying drawing, in which:

FIG. 1 shows a schematic cross-section through a wave guide clad using a previously proposed PECVD technique, illustrating voids and re-entrant areas which tend to appear adjacent to the base of the core, FIG. 2 shows a schematic cross-section through a wave guide clad by a method illustrative of the invention, FIG. 3 shows an electrical arrangement for use in the plasma deposition of the cladding illustrated in FIG. 2, and FIG. 4 shows a wave guide which has been clad, as shown in FIG. 2, and then etched in a step which forms an intermediate stage in the production of a wave guide illustrative of the invention.

DESCRIPTION OF PREFERRED EMBODIMENT

Referring to FIG. 1, a wave guide core 1 of germania doped silica or other suitable oxide lies on a substrate 2 of undoped silica, which is electrically inert. The substrate 2 may, in turn, rest on a base (not shown). A cladding layer 3, typically of silica glass doped with boron and phosphorus (BPSG), lies on the wave guide core 1 and, at least in the vicinity of the wave guide core 1, on the substrate 2. These parts are elongated, extending into and out of the plane of the drawing, and the direction of wave propagation is along the length of the finished wave guide.

In FIG. 1, the cladding 3 can be seen to have re-entrant portions 4 where the flanks of the wave guide meet the substrate 2. At 4 and 5 the cladding 3 is very thin; there may also be internal voids in the cladding layer 3. Since defects in the cladding, such as those shown at 4 and 5, may give rise to optical transmission problems, it is desirable that they be minimized or avoided.

Referring now to FIG. 2, it will be seen that improved conformity has been achieved in regions 6 and 7 adjacent to the junctions between the substrate 2 and the sides of the core 1 employing a biased PECVD deposition process which will be described below in illustration of the invention.

Reference will now be made to FIG. 3 in illustration of the process of the invention. In FIG. 3, the substrate 1 with the core 2 thereon is shown exposed to a source 8 of plasma radiation, shown by a plasma enhanced chemical vapour (PECVD) process as a result of which a deposit which may perhaps be 2.1 m thick of cladding is produced. One or more boron compounds such as diborane, $B_2H_6$, or boron tetraothylorthosilicate (B-Teos), and phosphine $PH_3$ or P-Teos are admitted as precursor materials to the chamber with silane $S_1H_4$ or Teos and nitrous oxide $N_2O$ (the latter being a preferable, cost-effective plasma source of oxygen ions), in suitable proportions to deposit BPSG. The latter provides suitable cladding, both as regards a lower flow temperature, compared to that of the core, for subsequent annealing, and good optical refractive indices for wave propagation. A radio frequency source 9 of between 500–2000 volts peak-to-peak and at a frequency of 385 kHz is connected to the substrate 1 through a high value capacitor 10 to energise the plasma ions from the directly grounded plasma source 8. A negative bias voltage of from about 50–500 volts d.c. can be developed, according to the value of the capacitor 10, and this improves the deposit of the cladding at regions 6 and 7, FIG. 2. An advantage is that, using the negative d.c. bias on the substrate with respect to earth, the cladding is deposited without the need to go to relatively higher temperatures of annealing, consequently with less tendency for the wave guide to distort.

The bias may be produced by a d.c. source other than that provided by the series capacitor 10 but the latter is found to be most convenient. The capacitor 10 must have a sufficiently large value to pass adequate radio frequency power to produce the plasma excitation.

Should the cladding deposit at regions 6 and 7 still be found to be inadequate, it can be Improved by plasma etching the whole area and then employing rapid thermal annealing. This procedure tends to remove cladding material selectively from the areas remote from regions 6 and 7 (FIG. 2), especially at the top corners of the core as viewed in FIG. 2, and the annealing process improves the optical consistency of the cladding after etching. The lower flow temperature of the cladding assist this process, since the core is doped in such manner (e.g. with Germania) that its temperature of flow is higher. Typical removal of material by each etching step may be 0.5 $\mu$m, except from the regions 6 and 7 where the step of etching tends to leave the deposit intact, especially at the bottom corers as mentioned.

The above removal of material by etching can be performed either after the deposition of the cladding has been completed, or preferably again by a PECVD process after each stage of a multi-stage deposition of the cladding. It is preferred, when there is a core of approximately 5 $\mu$m square cross-section for there to be a deposition of successive layers of 2 $\mu$m of cladding (which is finally to reach, say 16 $\mu$m in thickness), and after each deposition for the 0.5 $\mu$m of material to be removed, as described above, whereby the regions 6, 7 become relatively thicker. Before the next deposition stage, the etched layer may undergo rapid annealing.

For this multistage operation, the plasma chamber is charged with the requisite materials for the deposition of the cladding, the capacitor performing its function of developing suitable bias from, and in series with the radio frequency excitation. After the deposition of the 2.1 m, or whatever thickness has been selected for each stage, the plasma source 8 is switched off, the gases are pumped out, and then $CF_4$ or $CF_4+O_2$ is introduced for the ionisation of the plasma source and the radio frequency voltage is then switched on again. The fluorine ions are effective etchants, and about 0.5 $\mu$m of the cladding is first removed, the step of annealing is then performed, and the cladding precursor materials are then re-introduced into the plasma chamber, and the above three step routine is repeated. A simpler process for carrying out the etching stages is first to introduce pure argon in the PECVD chamber, and then to apply the radio frequency as before through a capacitor to the electrode supporting the wave guide, which takes advantage of the fact that the argon plasma will remove oxide, at the upper comers where the field is strongest.

Referring to FIG. 4, there is shown a wave guide core 1 which has received a first cladding deposit 11 of BPSG by means of PECVD process using the same precursor materials and the same electrical radio frequency energization as described with reference to FIG. 3, for developing a negative bias at the substrate during deposition. As a result, the lower corners 7 and 6 are fairly clear of defects and crevices, i.e. they conform reasonably with the internal corner. The resulting deposit is shaped in the vicinity of the lower corners as shown at 11. Using the apparatus of FIG. 3, the next steps are to turn off the source of precursor BPSG materials, and to introduce argon. The positive bias produced on the wave guide by the radio frequency power fed via the capacitor is maintained. The bombardment by the argon etches away the deposited cladding selectively at and near to the upper corners 12, so that the deposit 11 becomes very thin at these corners. Next, BPSG precursors are re-introduced, the BPSG deposition is repeated, and the etched away corners 12, 13 allow the arriving BPSG material to reach the lower corners 6, 7, with the result that an overhang is no longer exhibited at the top corners to shadow the arriving material and prevent it from reaching further down. The next BPSG layer 14 tends to cover these top corners preferentially again, and it may be advisable to use several stages of such argon etching, between the provision of the BPSG layers, to produce the good surface conforming cladding layer desired over the core 1.

Important features of the arrangements described are the provision of a negative bias developed at the substrate relative to the BPSG source, which not only improves the bombardment effect and tends to fill crevices at 6, 7, but also results in a laterally mobile quality of the cladding layer during deposition. Due to the latter effect, sideways movements of various elements of the cladding being deposited also tend to fill crevices and cover over thin points of the cladding layer. Another Important feature is the intermediate etching away an average of 0.5 $\mu$m, but more at the top corners, for instance using argon and negative developed bias.

It will be understood that although particular embodiments have been described, by way of example, to illustrate the invention, they are not limiting and that variations and modifications thereof, and other embodiments may be made within the scope of the protection sought.

I claim:

1. A method of providing a surface cladding on a planar wave guide optical circuit device having a doped silica core supported on a substrate, the wave guide having been formed by etching a layer of the core material to define an elongate structure of generally rectangular cross-section and having an upper surface and first and second side surfaces, the method including the steps of depositing by means of a plasma enhanced chemical vapour deposition (PECVD) process a glass cladding material on the wave guide core including the first and second side surfaces thereof, said glass cladding material having a lower flow temperature than that of the core material, and maintaining a negative electrical bias of about 50 to 500 volts between the substrate or the core and earth while the deposition is proceeding, wherein the bias is such that the cladding deposition on said first and second side surfaces of the core adjacent the substrate is uniform and free from re-entrant regions.

2. A method as claimed in claim 1, wherein the plasma ions are promoted by a radio frequency source of energy, and a series capacitor is connected between the radio frequency, source and the substrate to develop the negative voltage on the substrate relative to ground.

3. A method as claimed in claim 2, wherein a PECVD etching stage follows the PECVD deposition stage.

4. A method as claimed in claim 3, wherein the etching stage is also conducted with negative bias at the core.

5. A method as claimed in claim 4, wherein there is a plurality of PECVD deposition stages, each followed by a PECVD etching stage.

6. A method as claimed in claim 5, wherein the or each etching stage is conducted in the same chamber as the deposition stage(s), but with argon plasma as the working substance.

7. A method as claimed in claim 4, wherein an annealing stage follows the PECVD etching stage.

8. A method as claimed in claim 5, wherein each PECVD etching stage is followed by an annealing stage.

9. A method as claimed in claim 6, wherein the cladding comprises boron and phosphorus doped silica glass (BPSG).

10. A method as claimed in claim 5, wherein the etching stage involves charging the plasma environment with carbon tetrafluoride as the working plasma substance.

11. A method as claimed in claim 8, wherein the core is approximately 5 microns square in cross-section, the cladding is about 1.6 microns thick, and each deposition stage involves depositing 2 microns of cladding and each etching stage involves removing 0.5 microns from the principally clad area.

12. A method as claimed in claim 11, wherein the substrate is of silicon or quart.

* * * * *